(12) United States Patent
Yerushalmi

(10) Patent No.: US 11,679,981 B2
(45) Date of Patent: Jun. 20, 2023

(54) VAPOR PHASE TREATMENT OF MACROSCOPIC FORMATIONS OF CARBON NANOTUBES

(71) Applicant: Yissum Research Development Company of the Hebrew University of Jerusalem Ltd., Jerusalem (IL)

(72) Inventor: Roie Yerushalmi, Moshav Kfar Warburg (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 408 days.

(21) Appl. No.: 16/486,040

(22) PCT Filed: Feb. 21, 2018

(86) PCT No.: PCT/IL2018/050198
§ 371 (c)(1),
(2) Date: Aug. 14, 2019

(87) PCT Pub. No.: WO2018/154572
PCT Pub. Date: Aug. 30, 2018

(65) Prior Publication Data
US 2020/0087148 A1    Mar. 19, 2020

Related U.S. Application Data

(60) Provisional application No. 62/585,171, filed on Nov. 13, 2017, provisional application No. 62/461,331, filed on Feb. 21, 2017.

(51) Int. Cl.
*B32B 5/02* (2006.01)
*H01B 1/04* (2006.01)
(Continued)

(52) U.S. Cl.
CPC .............. *C01B 32/168* (2017.08); *B32B 5/02* (2013.01); *B82Y 30/00* (2013.01); *C01B 32/158* (2017.08);
(Continued)

(58) Field of Classification Search
CPC ....... B32B 5/02; C01B 32/168; C01B 32/158; C01B 32/174; H01B 1/04; H01B 1/24; C23C 16/06; C23C 16/26; B82Y 30/00
(Continued)

(56) References Cited

U.S. PATENT DOCUMENTS

2010/0320437 A1    12/2010   Gordon et al.
2011/0194990 A1*   8/2011    Hsu ........................ B82Y 30/00
                                                         422/211

FOREIGN PATENT DOCUMENTS

CN         1680512 A       10/2005
CN       104334820 A        2/2015
(Continued)

OTHER PUBLICATIONS

Hall "Metalcone Chemistry: In pursuit of improved mechanical properties in thin lm deposition." PhD thesis, https://scholar.colorado.edu/concern/graduate_thesis_or_dissertations/kk91fk733 (Year: 2013).*
(Continued)

*Primary Examiner* — Tri V Nguyen
(74) *Attorney, Agent, or Firm* — Vorys, Sater, Seymour and Pease LLP; Anthony P. Venturino

(57) ABSTRACT

Provided is a composite of a CNT assembly including a plurality of carbon nanotubes (CNTs) and at least one metalcone material, the composite being tunable, by a vapor phase chemical modification, to adopt one or more collective properties selected from mechanical, chemical, physical or electrical properties.

17 Claims, 6 Drawing Sheets

(51) Int. Cl.
    *H01B 1/24*    (2006.01)
    *B82Y 30/00*   (2011.01)
    *C23C 16/06*   (2006.01)
    *C23C 16/26*   (2006.01)
    *C01B 32/168*  (2017.01)
    *C01B 32/158*  (2017.01)

(52) U.S. Cl.
    CPC .............. *H01B 1/04* (2013.01); *H01B 1/24* (2013.01); *C23C 16/06* (2013.01); *C23C 16/26* (2013.01)

(58) Field of Classification Search
    USPC ............................ 252/500, 502, 506, 510
    See application file for complete search history.

(56) References Cited

FOREIGN PATENT DOCUMENTS

| TW | 200540255 A | 12/2005 | |
|----|----|----|----|
| WO | WO-2008127396 A2 * | 10/2008 | ............. B82Y 10/00 |
| WO | 2013/150533 A2 | 10/2013 | |

OTHER PUBLICATIONS

Sundberg "Organic and inorganic-organic thin film structures by molecular layer deposition: A review." Beilstein J. Nanotechnol. 2014, 5, 1104-1136. (Year: 2014).*

Farmer et al., "Atomic Layer Deposition on Suspended Single-Walled Carbon Nanotubes via Gas-Phase Noncovalent Functionalization", Nano Letters, 2006, vol. 6, No. 4, pp. 699-703.

Filleter et al., "Experimental-Computational Study of Shear Interactions within Double-Walled Carbon Nanotube Bundles", Nano Letters, 2012, vol. 12, pp. 732-742.

Mamedov et al., "Molecular design of strong single-wall carbon nanotube/polyelectrolyte multilayer composites", Nature Materials, vol. 1, pp. 190-194, (2002).

Olek et al., "Layer-by-Layer Assembled Composites from Multiwall Carbon Nanotubes with Different Morphologies", Nano Letters, 2004, vol. 4, No. 10, pp. 1889-1895.

Vivekanandhan et al., "Carbon nanotubes from renewable feedstocks: A move toward sustainable nanofabrication", J. Appl. Polym. Sci., 2017, pp. 44255 (15 pages).

Zhang et al., "Carbon Nanotube Mass Production: Principles and Processes", ChemSusChem, 2011, vol. 4, pp. 864-889.

Chinese Office Action for Chinese Application No. 201880009790. 6, dated Jun. 2, 2022, 7 pages.

* cited by examiner

VAPOR PHASE TREATMENT OF MACROSCOPIC FORMATIONS OF CARBON NANOTUBES

TECHNOLOGICAL FIELD

The present invention relates to modified carbon nanotube (CNT) assemblies and processes for their preparation.

BACKGROUND

Life quality is continually impacted by the available contemporary materials and technologies. This is because materials affect almost every aspect of daily experience starting from healthcare and continuing through common consumer products, sports, transportation and even homeland security. In recent years, a rapid increase in the rate of development in material science and technologies has been observed, with an accelerated rate of innovation, integration, and implementation of new material technologies across many fields. One of the many game-changing developments in materials capabilities is the advance of new synthetic methods, including large-scale, and continuous fabrication methods for carbon nanomaterials, specifically, for carbon nanotubes (CNTs) [1,2]. These advances can produce the nanomaterials in quantities, which would have appeared far-fetched just a decade ago.

The World Technology Evaluation Center (WTEC) report published in June 2007, focused on the status of CNT manufacturing and applications. At that time, the global fabrication capacity of multiwall carbon nanotubes (MWCNTs) was estimated at 300 tons per year, and that of single walled carbon nanotubes (SWCNTs) at 7 tons per year. Since then the CNT production capacity has grown dramatically with the introduction of new mass-production capabilities and new applications for CNT-based materials. The central role of CNT-based materials was evident throughout the report, identifying many objectives yet to be accomplished in the context of CNT-based materials.

Notably, the scope of CNT-based nanocomposite materials is quite wide with applications ranging from advanced batteries, super capacitors, light weight conductors, reinforced materials, antibacterial fabrics and more. However, despite extensive activity and major advances in the field of CNT-based composite materials, the de facto performance of CNTs, and CNT-based composites achieved so far, falls far short of the theoretical potential. For example, a comparison of theoretical and experimental data concluded that the reported strength and stiffness values for CNT-nanocomposites of different types, including, bulk, ribbons, fibers, and films, are still far from the maximal values predicted from the mechanical parameters such as the tensile strength of single, double, and multi-wall CNTs, as well as the CNT-matrix interfacial shear strength (IFSS) [3]. Nevertheless, CNTs are already among the strongest materials known, with single-walled CNTs possessing a remarkably high stiffness of about 1 terapascal (TPa), and strength of 52 gigapascal (GPa), values much higher than those of high-carbon steel. Although in practice, such tubes usually fail between 30 and 50 GPa on average, carbon nanotubes do have the theoretical potential to reach tensile strengths of 100 GPa and higher.

The establishment of procedures to develop carbon-based composite materials with superior performance requires improved methods for surface modification of macroscopic forms of CNT-based materials such as CNT mats, yarns, fibers, webs, carbon cloth, buckypaper, and others. Highly controlled surface modification and tailoring of the surface relativities of such carbon materials is not straightforward, partly because of the tendency of CNTs to undergo spontaneous and ill-controlled aggregation and phase segregation of the composite components during solution processing.

Furthermore, most of the currently practiced methods for preparing nanocomposite carbon-based materials involve solution treatments for introducing the matrix components and for densification of the yarns which leads to limited control over the process and non-uniform composition of the nanocomposite. This leads to limited functionality of the entire composite volume, mainly at the surface regions at the boundary of CNT bundles, with large variation in cross sectional density, because of inherent limitations encountered in the condensed phase. A major advance in the preparation of CNT composite materials was demonstrated by the introduction of Layer-by-Layer (LBL) solution assembly of CNT/polyelectrolyte composites by addressing some of the key limitations in processing CNTs [4,5]. Nevertheless, the currently available methodologies for processing CNT yarns are still quite limited.

Importantly, obtaining optimal functionality of high loading CNT-based nanocomposites, requires that the deposited matrix have a uniform, continuous, and maximal areal coverage over the CNT interfaces. Traditionally, covalent modification of the CNTs has commonly been considered to be important in order to obtain improved mechanical properties. However, at the same time, it is also known that defects, such as those introduced by covalent modification of the CNTs C-$sp^2$ atoms, degrade both the mechanical properties and the electronic conductance of the composite.

Specifically, coupling of metal oxides to CNT webs and CNT mats (woven and non-woven) requires surface treatment because of the incompatibility of the CNT surface with the polar oxide overlayers. Furthermore, it is desired to avoid covalent modification of the CNT surface which introduce the structural defects in the CNT structure and degradation of the electronic properties of the CNTs.

As an attempt to resolve these contradicting requirements, deposition of a surface binding layer, by ALD of nitrogen dioxide ($NO_2$) and trimethylaluminum (TMA) was attempted, resulting in a uniform coverage of metal oxides on CNTs [6]. In their work, Farmer, D. et al. describe the functionalization of the surface of a single-walled CNT using alternating exposure of nitrogen dioxide gas and trimethylaluminium vapor. The functionalized nanotube was susceptible to atomic layer deposition (ALD).

In particular, Farmer, D. et al [6] have demonstrated that a single single-walled CNT can be functionalized without degradation of their electronic properties by ALD treatment of $NO_2$ and TMA, forming an adsorbed layer that mediate high quality, conformal, and smooth deposition of oxides. The deposition of the $NO_2$-TMA layer on the CNT was self-limiting, acting as a binding layer between the non-polar, hydrophobic surface typical of CNTs and the polar interface of the deposited oxide layers. The mediating binding layer involves non-volatile polar complex formation that coordinates via non-covalent interactions at the CNT interface and mediates the deposition of the oxide layer.

International Patent Publication WO2013/150533 [7] discloses the conversion of thin films prepared by molecular layer deposition (MLD) to a metal oxide material.

REFERENCES

[1] Zhang Q, et al, *Chem. Sus. Chem,* 2011, 4, 864.
[2] Vivekanandhan S, et al. *J. Appl. Polym. Sci.,* 2017, 134, 44255.
[3] Filleter T, et al. *Nano Lett.,* 2012, 12, 732.
[4] Mamedov A A, et al. *Nat. Mat.,* 2002, 1, 190.
[5] Olek M, et al. *Nano Lett.,* 2004, 4, 1889.
[6] Farmer D B, Gordon R G. *Nano Lett.,* 2006, 6, 699.
[7] International Patent Application publication No. 2013/150533.

GENERAL DESCRIPTION

The present invention relates to processes where macroscopic formations of carbon nanotubes are treated by vapor-phase chemistry, specifically atomic layer deposition (ALD), molecular layer deposition (MLD) and combinations of ALD-MLD. The use of ALD, MLD, and ALD-MLD provides an effective means for tailoring surface properties of CNTs at the single, multi- and bundle levels. The vapor phase treatment results in the introduction of chemical functionalities at the CNT surface. The deposited layer is attached to the CNT surface mostly as non-covalent binding, but, to some extent, covalent biding at defect sites may take place. The process of the invention makes use of ALD, MLD, and ALD-MLD to macroscopic formations of CNTs such as CNT mats, yarns, fibers, webs, carbon cloth, buckypaper and other forms of macroscopic constructs of CNTs. The use of the vapor phase chemistry for treating the macroscopic CNT constructs overcomes limitations in chemical modification of macroscopic formations of CNTs that are typically encountered using other methods, for example, wet chemical synthesis using solvents where the limited wetting of the macroscopic CNT materials results in partial or non-homogenous modification of the bulk.

Thus, the inventors of the present invention disclosed herein have developed a breakthrough technique for the preparation of surface-functionalized macroscopic forms of CNT-based materials, such as CNT mats, yarns, fibers, webs, carbon cloth, buckypaper and others with high level of control over surface modification details, by relying on vapor phase reactions such as ALD and MLD. In providing the advancement disclosed herein, the inventors overcome the difficulties often encountered in the field of CNT-based nanocomposites, while addressing three key objectives: (i) optimization of CNT-CNT and CNT-matrix interactions (both the type and completeness of surface interactions), (ii) obtaining of an even distribution of CNT bundles with extreme geometrical aspect ratios in the CNT-matrix composite and (iii) optimization of the matrix designed to fulfill specific desired properties of the CNT-based composite.

Novel functionalized CNT-based materials such as CNT mats (woven and non-woven), yarns, fibers, webs, carbon cloth, buckypaper and others offer unique platform for attaining versatile functional materials featuring variable level of CNT alignment, surface-functionalized and controlled nano- to macro-scale architectures. These architectures are obtained via simple, yet powerful methods relying on vapor phase process for tailoring the surface chemistry of CNT-based materials employed over large macroscopic scales yet effective at the microscopic level at which these CNT assemblies are composed. The significance of introducing constructs with well-defined structural hierarchy at different length scales that allow for the systematic design and study of the nanocomposite material properties, surface properties, molecular interactions, and charge transport dynamics, is potentially very great.

As further schematically depicted in FIG. 5, the CNT mat (1A) comprising a plurality of CNT assemblies (1B) that may be obtained according to the invention. Each fiber in the mat (1A) comprises CNT assemblies (1B), which are composed or constructed of a plurality of CNTs (represented by cross-sections), each such plurality being coated with one or more layers of a metalcone material(s) (represented by the curved line). In 1C, a magnified illustration of an area marked by a square in 1B is shown. The first material layer that is directly associated with the CNTs (the CNT assembly) acts a "binding layer" onto which numerous other layers may be formed (dashed curve). The binding layer and any subsequent additional layer preserves the structural integrity of each of the CNTs in the CNT assembly and of the assembly as a whole. This is unlike covalent modifications that are applied to a CNT-based composite materials and in so doing introduce structural defects in the CNT structure which lead to degradation of the electronic properties of the CNTs.

The different modes of ALD, MLD, and ALD-MLD material deposition are depicted in a magnified view of the mat in FIG. 5 showing a combination of different deposition stages. As shown, deposition of the material layer, as explained further below, commences as discreet non-continuous deposition regions along an individual CNT assembly or bundle, and proceeds to form continuous deposition regions along a CNT assembly, on a junction where two or more CNT bundles cross each other, or any combination of these. At the onset of vapor deposition, and depending on the number of ALD/MLD cycles, material islands, continuous regions or full coverage of the assemblies or bundles ensues. For example, where the number of cycles is small (for example between 1 and 10) mainly islands are formed and as the number of cycles increases, the whole surface becomes covered.

Thus, against technologies known the art, the technology being the subject of the present application avoids the imposed structural defects or structural modifications to the CNTs.

Additionally, the invention provides means by which a surface region of small and large CNT assemblies, rather than individual CNTs surfaces, may be non-covalently modified to endow CNT assemblies with one or more modifications and attributes, such as altered mechanical properties, electrical properties, thermal properties, wetting properties, surface roughness and chemical reactivity.

As demonstrated herein, by treating pre-formed macro-assemblies such as CNT yarns, mats, sheets and webs, nanostructures, e.g., such as individual assemblies, within the macro-assemblies, may be modified. Also, functionalized macro-assemblies may additionally be obtained by functionalization of nanostructures, e.g., assemblies, which are used in the construction of the macro-assemblies.

The modified CNT material using MLD, or MLD-ALD sequence may then be used for preparation of composite materials using, for example, epoxy formulations, or other common chemical treatments where CNT are components of composite Thus, in one of its aspects, the invention provides a composite of carbon nanotubes (CNTs) and at least one metalcone material, the composite being tunable to adopt one or more collective property selected from mechanical, chemical, physical or electrical properties. The metalcone material in the composite may be distributed over the CNTs surface in a continuous form, namely may fully engulf the CNTs, or may be distributed over the CNTs at spaced-apart islands, or as anchor points through which further materials may be associated. The CNTs in the composite are provided as an assembly comprising two or more CNTs.

The assembly is mainly non-covalently surface-associated with the metalcone material. However, to some extent covalent modification may be present at defect sites. This may be enhanced by various chemical and physical treatments to control the degree of covalent to non-covalent modifications to the layer surface-associated with the CNTs.

In accordance with the invention, the composite may be in the form of a multilayered structure, or as an assembly of CNTs that are surface associated with one or more metalcone layers, thereby enabling macrostructures or macrocomposites of CNTs and metalcones.

The invention further provides a carbon nanotube (CNT) assembly comprising two or more CNTs, the assembly being non-covalently surface-associated with at least one material layer, wherein the at least one material layer comprising at least one metalcone and a plurality of surface-exposed groups.

In some embodiments, at least a portion of said surface-exposed groups are chemically modifiable.

The "carbon nanotubes" (CNTs) making up assemblies as used herein refer to CNTs known in the art. The term encompasses any one or combination of carbon allotropes of the fullerene family selected from single walled carbon nanotubes, double-walled carbon nanotubes and multi-walled carbon nanotubes. The CNT may have between 1 to 10 walls, and have varying dimensions. In some embodiments, the CNTs have high aspect ratios as measured by their ratio of length to diameter. The CNTs may have open or closed ends.

The "CNT assembly" refers to a compilation or a collection or an array or a bundle of two or more carbon nanotubes (CNTs). The assembly may be in the shape of a fiber that self-assembles into fiber bundles or a web in a random or an organized fashion. Thus, a CNT assembly according to the invention may be a compilation of two or more CNTs, which together form a fiber or a web and/or a CNT bundle that comprises at least one CNT fiber. The CNTs within the assembly may be branched, crosslinked, or share common walls with one another. The CNTs within the assembly may have any defined shape, positioning, orientation and density. For example the assembly comprises CNTs aligned in parallel. In some embodiments, the CNTs are assembled on a substrate or are collected in a macrostructure.

An assembly of CNT is said to be associated with a layer (a binding layer) of at least one metalcone material. The "non-covalent association" (or any lingual variation thereof) between the CNT assembly and the at least one material layer refers to any chemical or physical bond or interaction or association between the external exposed surface of the CNT assembly and a material layer that is formed thereon (surface-associated), and which does not involve sharing of electron pairs (non-covalent). Some non-limiting examples include physical attachment, electrostatic interactions such as ionic interaction, or hydrogen bonding, pi-effects such as $\pi$-$\pi$ interactions or other $\pi$-stacking interactions, dipole-dipole interactions and/or van der Waals force-mediated interactions. In some embodiments, the non-covalent association is non-volatile polar complex formation. The association can be either with any CNT unit comprised within the assembly, with the CNT assembly as a whole, e.g., with a CNT fiber, with any region of either CNT or assembly, or combination thereof.

As disclosed herein, the CNTs, in an assembly according to the invention, are associated with one or more material layers that comprise organic, inorganic, or hybrid organic-inorganic layer such as a metalcone species and a plurality of surface-exposed optionally modifiable groups. The plurality of surface-exposed optionally modifiable groups are ligand or coordinative groups associated with the metal atom. The modifiable ligands are covalent groups that associate to the metal atom(s). Thus, the CNT assembly may be regarded as a multilayered structure having a pseudo core/shell structure, wherein the core comprises a collection of CNTs (two or more as defined herein with reference to CNT assemblies, or a fiber(s), as defined) and each material layer constitutes a shell surrounding the core. The number of material layers (shells) may be dictated by any one of a variety of considerations that include, inter alia, the final intended use of the CNT assembly or any macro-scale product which incorporates the assembly, the surface property to be modified or to be adopted, the type of CNT used, the macrostructure to be formed, the macrostructure in which the CNT assemblies or fibers are structured, and others. Each material layer (shell) formed on the exposed surface of the CNTs in the assembly, as disclosed herein, is associated to another material layer (shell) via covalent bonds. Each material layer may be the same or different from any one other subsequent or preceding material layers, in form and composition.

Thus, for example, as shown in FIG. 6, assemblies of the invention may comprise one or any number of material layers on the CNT core. The CNT core comprises two or more CNTs or one or more fibers (each circle designates a single CNT or a CNT fiber, shown as cross-sections), 1, surrounded, coated, engulfed or associated with a first material layer, 2, and additional material layers, 3 through 5. It is to be understood that the number of layers may be at least one.

In one example, an assembly according to the invention comprises a single material layer, this assembly is structured of a collection of two or more CNTs (or fibers, as the core, 1) that are non-covalently surface-associated with a material layer 2.

In another example, an assembly according to the invention comprises two or more material layers, this assembly is structured of a collection of two or more CNTs (or fibers, as the core, 1) that are non-covalently surface-associated with one material layer 2, the material layer 2 is further associated with a material layer 3 that may be same or different in shape and composition, such that the two material layers, 2 and 3, are covalently associated with each other. Material layer 3 may optionally be further associated with another material layer 4, which in turn may be associated with another material layer 5 and so forth.

A final, top-most or surface exposed layer may be capped to disable further modifications, or may be functionalized with various functionalities (or surface-exposed groups) to tune one or more of the properties discussed herein. The number of a final layer depends on the number of layers in a composite. The final layer may be the second layer in a bilayer construction or the $100^{th}$ layer in a multilayered structure comprising 100 layers.

Assemblies of the invention may comprise at least one material layer. In some embodiments, the assemblies comprise between 1 and 100 material layer, between 1 and 90, 1 and 80, 1 and 70, 1 and 60, 1 and 50, 1 and 40, 1 and 30, 1 and 20, 1 and 10, 1 and 9, 1 and 8, 1 and 7, 1 and 6, 1 and 5, 1 and 4, or between 1 and 3 or 1, or 2 material layers.

In some embodiments, the number of material layers is 1 or 2 or 3 or 4 or 5 or 6 or 7 or 8 or 9 or 10.

A multilayered structure of the invention comprises a plurality of material layers, at least a portion of said material layers comprising at least one metalcone. In some embodiments, each of the material layers comprises at least one metalcone. In some embodiments, the material layer directly associated with the CNTs comprises a metalcone.

In some embodiments, the material layer formed directly on the CNT assembly or fiber comprises an aluminum metalcone, or a titanium metalcone.

A "metalcone" is a metal alkoxide or metal oxide species that comprises a metal atom covalently bonded to an oxygen atom forming an oxide or a hydroxide species or to at least one organic functionality providing the corresponding alkoxide. Where the metalcone is formed in the presence of water, metalcone oxides or hydroxides are formed, and where the metalcone is formed in the presence of organic functionalities, mainly alcohols, e.g., diols or triols, metalcone alkoxide are formed.

The metalcone layer comprises a plurality of metal atoms that may be in-layer associated to each other directly or indirectly via linking atoms (e.g., oxygen atoms) or via organic ligands, connecting to each of the metal atoms via a linking atom such as oxygen. The so linked metal atoms are further associated with one or more hydroxides, oxides or alkoxides that are surface exposed. These surface exposed groups are modifiable groups that may be chemically modified to attach capping groups, further modifiable groups or associate to another metalcone layer. Each metalcone layer may be grown by vapor deposition, e.g., molecular layer deposition (MLD) and/or atomic layer deposition (ALD), and is derived from sequential, self-limiting reactions of the metal and water and/or an organic precursor. For example, where organic precursors are involved, the reaction may involving multifunctional inorganic monomer with a homo- or hetero-multifunctional organic monomer.

The metalcone layers may comprise each a metalcone of a single metal atom or a combination of two or more metal atoms. Each metalcone layer may be of the same or different metal atoms. Similarly, any metalcone layer may be same or different in alkoxide or oxides composition and may vary also based on the selection of metal used. The metalcone composition may be determined by the number of ALD or MLD cycles. In some embodiments, the number of cycles of deposition is between 1 and 50, between 1 and 10, between 1 and 7, 1 and 5, or between 1 and 3. The number of cycles determines properties of a single metalcone layer. Each deposition cycle may provide a metalcone layer that is more thicker, more evenly distributed, more continuous, etc.

In some embodiments, the number of material layers comprising metalcone is determined by the density and circumference of the CNT assembly.

The metalcone may be selected amongst zincones, titanicones, vanadicones, zircones, hafnicones, mangancones, metal quinolones and hybrid materials.

The "metal" in each metalcone may be selected amongst metallic elements including transition metals and metalloids of the Periodic Table of the Elements. In some embodiments, the metals are transition metals or metalloids. In some embodiments, the metals are selected from Al, W, Sc, Ti, V, Cr, Mn, Fe, Co, Ni, Cu, Zn, Y, Zr, Nb, Mo, Tc, Ru, Rh, Re, Pd, Ag, Au, Cd, In, Sn, Sb, Te, Hg, Tl, Pb, Pt, Bi and Po. In some embodiments, the metal is selected from Zn, Zr, Fe, Ti, V, Cu, Ni, Bi and W.

In other embodiments, the metal is selected from Al, Ti, Zn, Fe, V, Ni, Cu and Cr.

In other embodiments, the metal is Ti, Al or Zn.

In some embodiments, any one metalcone layer or any layer formed in a multilayer on the surface of the CNT assembly may comprise a siloxane-based material.

The "surface exposed optionally modifiable groups" are the chemical functionalities extending away from the metalcone metal centers to the uppermost portion (surface) of each material layer and which are surface exposed to enable further modification, e.g., formation of a further material layer (that is covalently associated with a preceding layer), or surface functionalities (modified attributes, as further disclosed herein). These functionalities may be in a form that is chemically modifiable or capped to avoid further modifications or render the top most layer with a desired surface attribute, e.g., wetting, hydrophobicity, hydrophilicity etc. Where the groups are potentially modifiable groups, they may be selected from oxides, hydroxides, alkoxides, alkyl hydroxides, free amines, protected amines, alkyl amines and others, deposited by any one or a combination of ALD, MLD, graded layers ALD-MLD, and tandem ALD\MLD.

In some embodiments, the surface exposed optionally modifiable groups are selected from oxides, hydroxides and alkoxides. Where oxides are surface-exposed, they are typically in the form of metal hydroxides or metal oxides. Where alkoxides are surface-exposed, they are typically in the form of hydroxy alkyl groups, with the alkyl length varying based on the alkyl diol or triol or higher homologue used in the preparation of the metalcone layer. In some embodiments, the oxides are derived from metal oxides such as those disclosed herein, as well as from metal oxides such as $RuO_2$, $IrO_2$, $V_2O_5$, $Fe_3O_4$, $MnO_2$, $NiO$, $TiO_2$, $Co_3O_4$ and $NiCo_2O_4$.

When alkyl diols, e.g., ethylene glycol, or higher alcohol homologues are used, the metalcone layer may comprise a combination of metal centers, each metal center may be associated with the alkyl alcohols in one of a number of ways depending, inter alia, on the number of alcohol groups in the alkyl alcohol, the length of the alkyl groups extending between the two or more alcohols, etc. For example, where ethylene glycol is used, one of the oxygen atoms may be associated with the metal center while the other may be surface exposed as an hydroxyl (—OH) group. Additionally or alternatively, one of the oxygen atoms may be associated with the metal center while the other may be associated with a neighboring metal atom. Yet additionally or alternatively, both oxygen atoms may be associated with the metal center, thereby rendering the ethylene glycol group unavailable for chemical modifications. In some embodiments, all three possibilities may co-exist in a single metalcone layer, thus providing a mixed or a hybrid layer.

The constitution of such hybrid layers may be further modified in order to entail more fine-tuned characteristics to a material layer. One such modification may include the addition of silicon-based groups to the layer.

The invention further provides a process for the preparation of CNT assemblies according to the invention. Generally speaking, a material layer, provided directly on the CNT assembly or on a preceding previously formed layer, is formed by vapor phase deposition. The vapor phase deposition may be one or a combination of atomic layer deposition (ALD), molecular layer deposition (MLD), combined ALD/MLD, spatial ALD, and tandem catalyst ALD/MLD. ALD and MLD are vapor phase chemical techniques, which can be used separately or in combination, allowing thin-film deposition via consecutive and self-limiting surface reactions. ALD allows inorganic film depositions and MLD allows organic film depositions. Spatial ALD (S-ALD)

involves layer-by-layer film deposition in which reactive precursors are separated in space rather than in time, as with conventional ALD. In tandem catalyst ALD/MLD, each sub-cycle catalyzes the deposition of the complementary sub-cycle.

In a process according to the invention, an assembly of CNT, whether in the form of a CNT fiber or a CNT mat or CNT web or a buckypaper, is treated under ALD and/or MLD conditions to allow coating of the collections of CNTs (assemblies, as defined herein) with a material layer of at least one metalcone. Where the CNT assembly is bare, namely is not associated with any material layer, the first deposition step provides a material layer that is non-covalently associated with the assembly, as detailed herein. Any further deposited layer, is covalently associated with a preceding layer and a subsequently deposited layer.

Thus, there is provided a process for non-covalently associating a CNT assembly with a film of at least one metalcone, the method comprising exposing said CNT assembly to at least one precursor of the at least one metalcone under conditions permitting vapor deposition of said at least one precursor on a surface region of the assembly and formation of the metalcone film.

In some embodiments, the process further comprises a step of covalently associating a further layer to said at least non-covalently associated layer, the step comprising reacting the CNT assembly having a metalcone film on at least a surface region of the assembly under conditions permitting formation of one or more material layers on the metalcone film, wherein each material layer is covalently associated with at least one neighboring layer.

The process of the invention permits the construction of the pseudo-core/shell structure discussed hereinabove, layer by layer, wherein each layer may be the same or different from any of the other layers in the structure. Depending on the layer composition, the conditions and material precursors used in the construction of the layer may vary. Generally speaking, the process of the invention is an atomic layer deposition process (ALD) and/or a molecular layer deposition process (MLD). As known in the art, ALD is a self-limiting process, during which an amount of a layer material deposited in each reaction cycle is constant. The process involves deposition of precursor materials onto a substrate, in the present case, a CNT assembly. While the precursors, reagents and material sources used in an ALD step are eventually reacted in the vapor phase, the precursors can be either liquid or solid which are transported via direct vaporization, bubbling or sublimation into contact with the CNT assembly.

Unlike ALD, a MLD cycle may comprise reacting a functionalized surface of a CNT assembly with a metal precursor, followed by reacting the thus formed metal center with organic precursor, e.g., diols, triols or higher alcohol homologues, to form a material layer that is covalently associated with a layer onto which it is deposited (a previously formed layer or a first layer directly associated with the CNT assembly). The MLD steps or cycles may be repeated as many times as needed to afford a multilayered structure or shells, and reach a desired thickness or functionality. In some embodiments, a multi-layer deposition scheme may be used to achieve a multilayered structure.

Thus, in processes of the invention, the first material layer formed on the surface of the CNT assembly may be deposited by ALD, and each subsequent layer may be deposited by MLD. In some embodiments, at least one layer is deposited by ALD and another of the layers are deposited by MLD.

In some embodiments, the first material layer is formed by vapor deposition, as defined herein, and any subsequent layer may be formed by any other deposition method, not necessarily involving vapor phase deposition.

In some embodiments, the process comprises contacting at least one CNT assembly with at least one metalcone precursor composition under ALD conditions permitting formation of a metalcone layer non-covalently associated to the surface of the at least one CNT assembly.

The ALD/MLD conditions may vary in accordance with processing parameters known in the art. The materials that may be deposited in accordance with ALD or MLD and the conditions that can be used may be adapted from the general state of the art. See for example Meng X., *J. Mater. Chem. A*, 2017, 5, 18326; Leskela M., *Thin Solid Films*, 2002, 409, 138; and Van Bui H., *Chem. Commun.*, 2017, 53, 45. The content of any of these publications, vis-à-vis ALD/MLD conditions and materials is incorporated herein by reference.

In some embodiments, the ALD step is carried out in an ALD reactor, and the process comprises introducing into the ALD reactor at least one metalcone precursor composition under conditions permitting direct vaporization, bubbling or sublimation into contact with the CNT assembly.

In some embodiments, the ALD/MLD reactor is selected from conventional ALD reactor, fluidized bed rector, high pressure spatial ALD reactor or any other type of reactor.

The "at least one metalcone precursor composition" is a collection of several precursors and/or materials. As the metalcone comprises a metal atom and one or more same or different ligand groups, as described herein, the at least one metalcone precursor composition comprises at least one metal source, at least one hydroxide precursor and optionally at least one organic alcohol material. The at least one hydroxide precursor material and the at least one alcohol material have each an ALD or MLD reactive end group (such as a OH group) and at least one surface tailoring or surface modifying group (which may be a capping group or at least one groups that may be chemically modified or substituted).

The at least one metal source is a metal salt or metal complex of any metallic element of the Periodic Table of the Elements. In some embodiments, the metal source is of a transition metal or a metalloid. In some embodiments, the metal source is of a metal selected from Al, W, Sc, Ti, V, Cr, Mn, Fe, Co, Ni, Cu, Zn, Y, Zr, Nb, Mo, Tc, Ru, Rh, Re, Pd, Ag, Au, Cd, In, Sn, Sb, Te, Hg, Tl, Pb, Pt, Bi and Po. In some embodiments, the metal source is of a metal selected from Zn, Zr, Fe, Ti, V, Cu, Ni, Bi and W. In other embodiments, the metal is selected from Al, Ti, Zn, Fe, V, Ni, Cu and Cr. In other embodiments, the metal is Ti, Al or Zn.

The metal salt or metal complex may be selected from:
a metal halide, wherein the halide is selected from CI, Br, I and F;
a metal alkoxide;
a metal alkyl, wherein the alkyl ligand may be a long alkyl group (comprising more than 5 carbon atoms, including aryl groups), or a short alkyl group (comprising between 1 and 5 carbon atoms), wherein the alkyl is optionally substituted with one or more alcohol or amine groups;
a metal acetylacetonate; and
a metal complex with one or more ligand moieties.

In some embodiments, the metal source is selected from aluminum acetylacetonate, aluminum s-butoxide, aluminum ethoxide, aluminum hexafluoro acetylacetonate, aluminum i-propoxide, dimethylaluminum i-propoxide, tri-i-butylaluminum, triethylaluminum, triethyl(tri-sec-butoxy)dialuminum, tris(2,2,6,6-tetramethyl-3,5-heptanedionato)aluminum, triphenyl bismuth, tris(2,2,6,6-tetramethyl-3,5-heptanedionato)bismuth(III), dimethylcadmium, bis(cyclopentadienyl)chromium, bis(ethylbenzene)chromium, bis(pentamethylcyclo pentadienyl)chromium, bis(i-propyl-cyclopentadienyl)chromium, chromium(III) acetylacetonate, chromium carbonyl, chromium(III) hexafluoroacetylacetonate, tris(2,2,6,6-tetramethyl-3,5-heptane dionato) chromium(III), bis(cyclopentadienyl)cobalt(II), bis(N,N'-di-i-propylacetamidi nato)cobalt(II), cobalt tricarbonyl nitrosyl, tris(2,2,6,6-tetramethyl-3,5-heptane dionato)cobalt (III), bis(2,2,6,6-tetramethyl-3,5-heptanedionato) copper (II), copper(II) hexafluoroacetylacetonate, copper(II) hexafluoroacetylacetonate, copper(II) hexafluoro acetylacetonate, copper(II) trifluoroacetylacetonate, dimethyl (acetylacetonate)gold(III), dimethyl(trifluoroacetylacetonate)gold(III), indium(III) trifluoroacetylacetonate, trimethylindium, tris(2,2,6,6-tetramethyl-3,5-heptanedionato) indium (III), bis(cyclo pentadienyl)iron, bis(N,N'-di-t-butyl acetamidinato)iron(II), bis(ethylcyclo pentadienyl) iron, bis(pentamethylcyclopenta dienyl)iron, bis(i-propylcyclopenta dienyl)iron, cyclohexadiene iron tricarbonyl, iron pentacarbonyl, iron pentacarbonyl, iron(III) trifluoroacetylacetonate, tris(2,2,6,6-tetramethyl-3,5-heptanedionato)iron(III), bis(2, 2,6,6-tetramethyl-3,5-heptanedionato)lead(II), bis(ethylcyclopentadienyl) manganese, bis(ethylcyclopentadienyl) manganese, bis(penta methylcyclopentadienyl) manganese, manganese carbonyl, tris(2,2,6,6-tetramethyl-3,5-heptanedionato) manganese(III), bis(ethylbenzene)molybdenum, cycloheptatriene molybdenum tricarbonyl, molybdenum carbonyl, bis(cyclopentadienyl)nickel, bis(ethylcyclo pentadienyl)nickel, bis(pentamethyl cyclopentadienyl)nickel, bis (i-propylcyclopenta dienyl)nickel, bis(2,2,6,6-tetramethyl-3,5-heptanedionato)nickel(II), nickel(II) acetylacetonate, nickel(II) acetylacetonate, nickel carbonyl, bis(2,2,6,6-tetramethyl-3,5-heptanedionato)palladium(II), platinum(II) hexafluoroacetylacetonate, tetrakis (trifluorophosphine) platinum, (trimethyl)methyl cyclopentadienylplatinum (IV), (trimethyl)methylcyclopentadienylplatinum(IV), pentamethylcyclopentadienyl rhenium tricarbonyl, i-propylcyclo-pentadienylrhenium tricarbonyl, rhenium carbonyl, carbonyl(pentamethylcyclopentadienyl)rhodium(I), rhodium(III) acetylacetonate, bis(cyclopentadienyl)ruthenium, bis(ethylcyclo pentadienyl)ruthenium(II), bis(penta methylcyclopentadienyl)ruthenium, bis(2,2,6,6-tetramethyl-3,5-heptanedionato)(1,5-cyclooctadiene)ruthenium(II), ruthenium carbonyl, tris(2,2,6,6-tetramethyl-3,5-heptanedionato)ruthenium(III), tris(2,2,6,6-tetramethyl-3,5-heptanedionato) scandium (III), 2,2,6,6-tetramethyl-3,5-heptanedionato silver(I), triethoxyphosphine (trifluoroacetylacetonate)silver (I), triethylphosphine(6,6,7,7,8,8,8-heptafluoro-2,2-dimethyl-3,5-octanedionate)silver(I), trimethylphosphine (hexafluoroacetylacetonato) silver(I), vinyltriethylsilane (hexafluoroacetylacetonato)silver(I), 2,2,6,6-tetramethyl-3, 5-heptanedionato thallium(I), thallium(I) ethoxide, thallium (I) hexafluoro acetylacetonate, N,N'-di-t-butyl-2,3-diamidobutanetin(II), N,N'-di-t-butyl-2,3-diamido butanetin (II), tetrakis(dimethylamino)tin(IV), tetrakis (dimethylamino) tin(IV), tetramethyltin, tin(II) acetylacetonate, tin(IV) t-butoxide, tin(II) hexa fluoroacetylacetonate, cyclopentadienyl(cycloheptatrienyl)titanium(II), tetrakis (diethyl amino)titanium(IV), tetrakis(dimethylamino)titanium(IV), tetrakis(dimethylamino) titanium(IV), titanium(IV) n-butoxide, titanium(IV) t-butoxide, titanium(IV) ethoxide, titanium(IV) i-propoxide, (trimethyl)pentamethyl cyclopentadienyltitanium(IV), tris(2,2,6,6-tetramethyl-3,5-heptanedionato)titanium(III), mesitylene tungsten tricarbonyl, tungsten carbonyl, bis(cyclopentadienyl)vanadium, cyclopentadienyl vanadium tetracarbonyl, vanadium(III) acetylacetonate, vanadium(V) trichloride oxide, vanadium (V) tri-i-propoxy oxide, tris[N,N-bis(trimethylsilyl)amide] yttrium(III), tris(butylcyclopentadienyl)yttrium, tris(cyclopentadienyl)yttrium, tris(methylcyclo pentadienyl)yttrium, tris(n-propylcyclopentadienyl)yttrium, tris(2,2,6,6-tetramethyl-3,5-heptanedionato)yttrium(III), yttrium(III) hexafluoroacetylacetonate, bis(2,2,6,6-tetra methyl-3,5-heptanedionato)zinc, diethylzinc, dimethylzinc, bis(cyclopentadienyl) dimethylzirconium, dimethylbis(t-butylcyclopentadienyl) zirconium, tetrakis(diethyl amino)zirconium, tetrakis(dimethylamino)zirconium, tetrakis(ethylmethylamino) zirconium, tetrakis(2,2,6,6-tetramethyl-3,5-heptanedionato)zirconium(IV), zirconium (IV) t-butoxide, zirconium(IV) ethoxide and zirconium(IV) hexafluoro acetylacetonate.

Any of the above listed metal sources may be equivalently used with different metal atoms other than the specifically listed. For example, where zirconium(IV) hexafluoro acetylacetonate is provided herein, as an example of a metal source, in a similar fashion a different metal may be used as an hexafluoro acetylacetonate or acetylacetonate complex.

In some embodiments, the metal source is a metal halide.

In other embodiments, the metal source is of Ti, the material being selected from bis(tert-butylcyclopentadienyl) titanium(IV) dichloride; bis(diethylamido) bis(dimethyl amido)titanium(IV); tetrakis(diethylamido)titanium(IV); tetrakis (dimethylamido) titanium(IV); tetrakis(ethylmethylamido)titanium(IV); titanium(IV) diisopropoxidebis (2,2, 6,6-tetramethyl-3,5-heptanedionate); titanium(IV) isopropoxide; and titanium tetrachloride.

In some embodiments, the metal source is a metal oxide.

In some embodiments, the metal oxide is as selected above.

In some embodiments, the metal oxide is selected from metal oxides used in super capacitors and batteries. In some embodiments, the metal oxide is selected from $RuO_2$, $IrO_2$, $V_2O_5$, $Fe_3O_4$, $MnO_2$, $NiO$, $TiO_2$, $Co_3O_4$ and $NiCo_2O_4$.

In some embodiments, the metal source is selected from $TiCl_4$, trimethylaluminum (TMA) and Zn salts or complexes.

The at least one hydroxide precursor or oxygen sources is any material which upon interaction with the metal atom yields metal atoms that are associated or bonded to one or more oxide or hydroxide groups. Non-limiting examples include water, ozone, organic acid (carboxylic acids) or other forms.

The at least one organic alcohol is selected from organic diols, triols, tetraols or any polyhydric alcohol. Non-limiting examples include ethylene glycol, propylene glycol, propylene triol, glycerol, threitol, xylitol, sorbitol and others. In some embodiments, the organic alcohols are selected amongst 1,2-alkyls, 1,3-alkyls, 1,4-alkyls, 1,5-alkyls and higher homologues, as well as triols and tetraol derivatives thereof.

In some embodiments, the metalcone precursor composition comprises at least one metal source and at least one hydroxyl precursor.

In some embodiments, the metalcone precursor composition comprises at least one metal source and at least one organic alcohol.

In some embodiments, the metalcone precursor composition comprises at least one metal source, at least one organic alcohol and at least one hydroxyl precursor.

In some embodiments, the metalcone precursor composition comprises at least one metal source ethylene glycol and water.

The selection of precursors or materials to be contained in the at least one metalcone precursor composition depends, inter alia, on the layer to be formed (e.g., whether the first layer directly associated with the CNT assembly or the most exposed layer), the composition of the layer, the method of deposition (e.g., ALD, MLD, etc), the desired functionalities to be endowed, whether or not the layer formed is to be further modified, and others. In some embodiments, the composition may further comprise at least one material capable of forming inter or intra layer hydrogen-bonds, at least one material having electron acceptor or electron donor functionalities, at least one material capable of pi stacking or pi-pi interactions, at least one crosslinking material, at least one pH adjusting material, at least one material having hydrophobic or hydrophilic functionalities, at least one material, at least one bifunctional material, and others. In some embodiments, each of the above materials comprises at least one end group having the recited functionality and another end group that is ALD or MLD reactive (e.g., OH group).

The deposition steps may result in metalcone oxide layer(s), metalcone organic layer(s), and/or hybrid organic-inorganic layer(s). In some embodiments, hybrid layers are formed, said hybrid layers comprise each a metal atoms that are associated with organic groups and oxides.

In order to achieve surface modified CNT assemblies in accordance with the invention, the CNT assemblies may be individually treated. Thereafter, the modified CNT assemblies may be formed into CNT yarns, webs and other CNT macrostructures. Alternatively, the inventors have found that treating an already prepared CNT macrostructure in accordance with processes of the invention, CNT assemblies making up the macrostructures undergo surface modification as if treated individually. The CNT assemblies in the CNT macrostructure undergo surface modification on the circumference of the assembly.

Material deposition on the macrostructure results in functionalization that is at least equivalent to functionalization achieved on individual CNT assemblies or CNTs, however is more efficient, more controlled, more cost-effective to achieve, time consuming and more importantly does not necessitate multistep manipulation of CNTs to provide tunable macrostructures. In some embodiments, the functionalization of the entire macrostructure is improved relative to functionalization of CNT assemblies.

Thus, the invention further provides a macrostructure comprising two or more CNT assemblies, as defined herein, each assembly comprising two or more CNTs, each of the two or more CNT assemblies is non-covalently surface-associated with at least one material layer, each of the at least one material layers comprising at least one metalcone and a plurality of surface-exposed optionally modifiable groups.

A macrostructure of the invention may be formed by arraying a plurality of CNT assemblies into a CNT macrostructure or by treating a macrostructure under the ALD/MLD conditions discussed herein.

The "macrostructure" is a collection of CNT assemblies that are distributed, optionally uniformly, to provide a material continuity which comprises mainly or substantially (or consists) a plurality of CNT assemblies. The CNT assemblies comprised within the macrostructure may be associated via their surface layers. For example, they may be associated by any one or combination of hydrogen bonds (donor and acceptor), cross linking and pi-interaction. In some embodiments, the macrostructure is selected from a web, a woven mat, a non-woven mat, a hydrogel, a bundle of assemblies, a CNT powder, a buckypaper, a CNT paper and a carbon fiber.

In summary, the invention provides a composite of a CNT assembly comprising a plurality of carbon nanotubes (CNTs) and at least one metalcone material. The composite is tunable to adopt one or more collective properties selected from mechanical, chemical, physical or electrical properties. The composite is formed by a vapor phase chemical modification, comprising associating said composite with one or more materials inducing said properties.

The at least one metalcone material may be distributed over the surface of the plurality of CNTs in a continuous form, either fully engulfing the plurality of CNTs, or distributed over the plurality of CNTs in spaced apart regions.

The assembly may be non-covalently surface-associated with the at least one metalcone material.

The composite may be in a form of a multilayered structure, wherein the CNT assembly forms the inner-most part of the multilayered structure and each of the at least one metalcone material forms at least one layer on the surface of the CNT assembly.

The composite may comprise a CNT assembly non-covalently surface-associated with at least one metalcone layer having a plurality of surface-exposed groups.

The composite may comprise a CNT assembly non-covalently surface-associated with a plurality of metalcone layers.

The at least a portion of said surface-exposed groups may be chemically modifiable.

The CNT assembly may be associated with one metalcone layer, the metalcone layer being associated with one or more material layers, any one of said material layers being covalently associated to another of said material layers.

The composite may comprise at least one material layer free of a metalcone material.

The multilayered structure comprises a CNT assembly non-covalently associated with a metalcone layer and optionally one or more material layers, each of said one or more material layers being covalently associated to each other.

The composite may comprise between 1 and 100 material layers.

The at least one metalcone material may be selected amongst metal alkoxides having a metal atom covalently bonded to at least one organic moiety or metal oxide having an oxygen atom forming an oxide or a hydroxide species.

The metalcone layer non-covalently associated to the surface of the CNT assembly may be formed by vapor deposition.

The composite may comprise the metalcone layer on the surface of the CNT assembly and optionally at least one additional metalcone layer covalently associated with the layer on the surface of the CNT assembly, wherein the metalcone layer on the surface of the CNT assembly is formed by atomic layer deposition (ALD) the at least one additional metalcone layer is formed by molecular layer deposition (MLD).

The metalcone layer comprises a plurality of metal atoms in-layer associated to each other, directly or via bridging atoms or organic ligands, wherein the metal atoms are further associated with one or more surface exposed hydroxides, oxides and/or alkoxide groups.

The metalcone comprises at least one metal selected from Al, W, Sc, Ti, V, Cr, Mn, Fe, Co, Ni, Cu, Zn, Y, Zr, Nb, Mo, Tc, Ru, Rh, Re, Pd, Ag, Au, Cd, In, Sn, Sb, Te, Hg, Tl, Pb, Pt, Bi and Po.

The metal may be selected from Zn, Zr, Fe, Ti, V, Cu, Ni, Bi and W.

The metal may be selected from Al, Ti, Zn, Fe, V, Ni, Cu and Cr.

The metal may be Ti, Al or Zn.

The metalcone material may be selected amongst zincones, titanicones, vanadicones, zircones, hafnicones, mangancones, metal quinolones and hybrid materials.

The surface exposed groups may be modifiable to covalently associate to a further material layer, or to associate to surface functionalities, or capped to avoid further modifications.

The modifiable groups may be selected from oxides, hydroxides, alkoxides, alkyl hydroxides, free amines, protected amines and alkyl amines.

The modifiable groups may be selected from oxides, hydroxides and alkoxides.

The alkoxides may be derived from alkyl diols or triols or a polyhydric alcohol.

The alkoxides may be derived from ethylene glycol.

The CNT assembly may be part of a CNT macrostructure selected from a CNT mat, a CNT yarn, a CNT fiber, CNT web, a carbon cloth and a buckypaper.

A composite is provided that comprises a CNT macrostructure and at least one metalcone material. The CNT macrostructure may be selected from a CNT mat, a CNT yarn, a CNT fiber, CNT web, a carbon cloth and a buckypaper.

A process is provided for manufacturing a composite comprising at least one CNT assembly and one or more material layers provided directly on the CNT assembly, the process comprising:
  forming by ALD a first material layer on the at least one CNT assembly; and
  forming one or more additional material layers on said first material layer by ALD, MLD, combined ALD/MLD or tandem ALD/MLD,
  wherein the first material layer comprises at least one metalcone.

The at least one of the one or more material layers may comprise at least one metalcone.

The process may comprise:
  treating a CNT assembly under ALD conditions with at least one metalcone precursor composition to form a first coating or film of at least one metalcone material on the surface of at least one CNT assembly;
  treating the CNT assembly one or more times under ALD, MLD or ALD/MLD conditions to form one or more additional material layers on the first coating or film.

The coating or film of the at least one metalcone may be non-covalently associated to the at least one CNT assembly.

The CNT assembly may be part of a CNT macrostructure selected from a CNT mat, a CNT yarn, a CNT fiber, CNT web, a carbon cloth and a buckypaper.

The process may comprise:
  treating a CNT macrostructure under ALD conditions with at least one metalcone precursor composition to form a first coating or film of at least one metalcone material on the surface of at least one CNT assembly comprised in the macrostructure;
  treating the CNT macrostructure one or more times under ALD, MLD or ALD/MLD conditions to form one or more additional material layers on the first coating or film;
  wherein the first coating or film of the at least one metalcone material is non-covalently associated to the at least one CNT assembly.

The process may comprise treating the CNT macrostructure one or more times under ALD, MLD or ALD/MLD conditions to form a bilayer or a multilayered structure on the surface of the first coating or film, wherein each of the layers in the bilayer or multilayer is same or different, each optionally comprising at least one metalcone material.

The process may further comprise forming a material layer free of a metalcone.

The at least metalcone precursor composition may comprise at least one metal source and one or more same or different ligand groups selected from at least one hydroxide precursor and optionally at least one organic alcohol material.

The at least one metal source may comprise a metal selected from Al, W, Sc, Ti, V, Cr, Mn, Fe, Co, Ni, Cu, Zn, Y, Zr, Nb, Mo, Tc, Ru, Rh, Re, Pd, Ag, Au, Cd, In, Sn, Sb, Te, Hg, Tl, Pb, Pt, Bi and Po.

The at least one metal source may be in the form of a metal salt or a metal complex.

The metal salt or metal complex is selected from a metal halide, a metal alkoxide, a metal alkyl, a metal acetylacetonate and a metal complex with one or more ligand moieties.

The metal salt is a metal halide.

The metal source may be selected from bis(tert-butylcyclopentadienyl)titanium(IV) dichloride; bis(diethylamido) bis(dimethyl amido)titanium(IV); tetrakis(diethylamido)titanium(IV); tetrakis (dimethylamido) titanium(IV); tetrakis (ethylmethylamido)titanium(IV); titanium(IV) diisopropoxidebis (2,2,6,6-tetramethyl-3,5-heptanedionate); titanium (IV) isopropoxide; and titanium tetrachloride.

The metal source may be selected from $TiCl_4$, trimethylaluminum (TMA) and Zn salts or Zn complexes.

The at least one hydroxide precursor or oxygen source may be selected from water, ozone and organic acids.

The at least one organic alcohol may be selected from organic diols, triols, tetraols or polyhydric alcohols.

The at least one organic alcohol may be selected from ethylene glycol, propylene glycol, propylene triol, glycerol, threitol, xylitol and sorbitol.

The metalcone precursor composition may comprise at least one metal source and at least one hydroxyl precursor.

The metalcone precursor composition may comprise at least one metal source and at least one organic alcohol.

The metalcone precursor composition may comprise at least one metal source, at least one organic alcohol and at least one hydroxyl precursor.

The metalcone precursor composition may comprise at least one metal source ethylene glycol and water.

The process may be used for providing a CNT macrostructure comprising at least one material layer selected from a metalcone oxide layer, a metalcone organic layer and a hybrid organic-inorganic layer.

The CNT assembly may be a CNT macrostructure.

A composite is provided of a CNT macrostructure comprising two or more CNT assemblies, non-covalently surface-associated with at least one material layers comprising at least one metalcone and a plurality of surface-exposed optionally modifiable groups.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 3A—Growth per cycle (GPC) for the process at 150° C.; FIG. 3B—Electrical tuning of Ti—Si thin films annealed films at 550, 750, and 1050° C. under Ar atmosphere vs. MLD-ALD super-cycle details (m/n). FIG. 3C—XPS analysis quantifying the relative contribution of $Si^{3+}$ and $Si^{4+}$ species. The oxidation state of Si suggests that Si—C functions as a reducing agent while $TiO_2$ acts as an oxidant resulting in the formation of a sub-stoichiometric conductive Magnéli phase of Ti oxide.

FIG. 4A—presents thickness vs. cycles (marker size in FIG. 4C represent maximal experimental error limit) and FIG. 4B growth per cycle (GPC) comparison for DE-AMTMS, DM-APTMS, APTMS and TMOS for 1:1 MLD:ALD process.

DETAILED DESCRIPTION OF EMBODIMENTS

A combined methodology using MLD and ALD is presented where, for example, MLD, a hybrid organic-inorganic film is deposited for managing the surface properties of CNT mats and in the following step oxide layer is deposited by ALD for altering the mechanical properties of the assembly. Ethylene glycol (EG) and trimethyl aluminum (TMA) may be used for MLD for depositing a hybrid layer relying mostly on non-covalent attachment at the CNT surface. Water and TMA are used for a second deposition using ALD where cross-linking of the MLD deposited layer and additional oxide layer are formed. Alternative sequences are also disclosed and exemplified herein.

Figure 1:
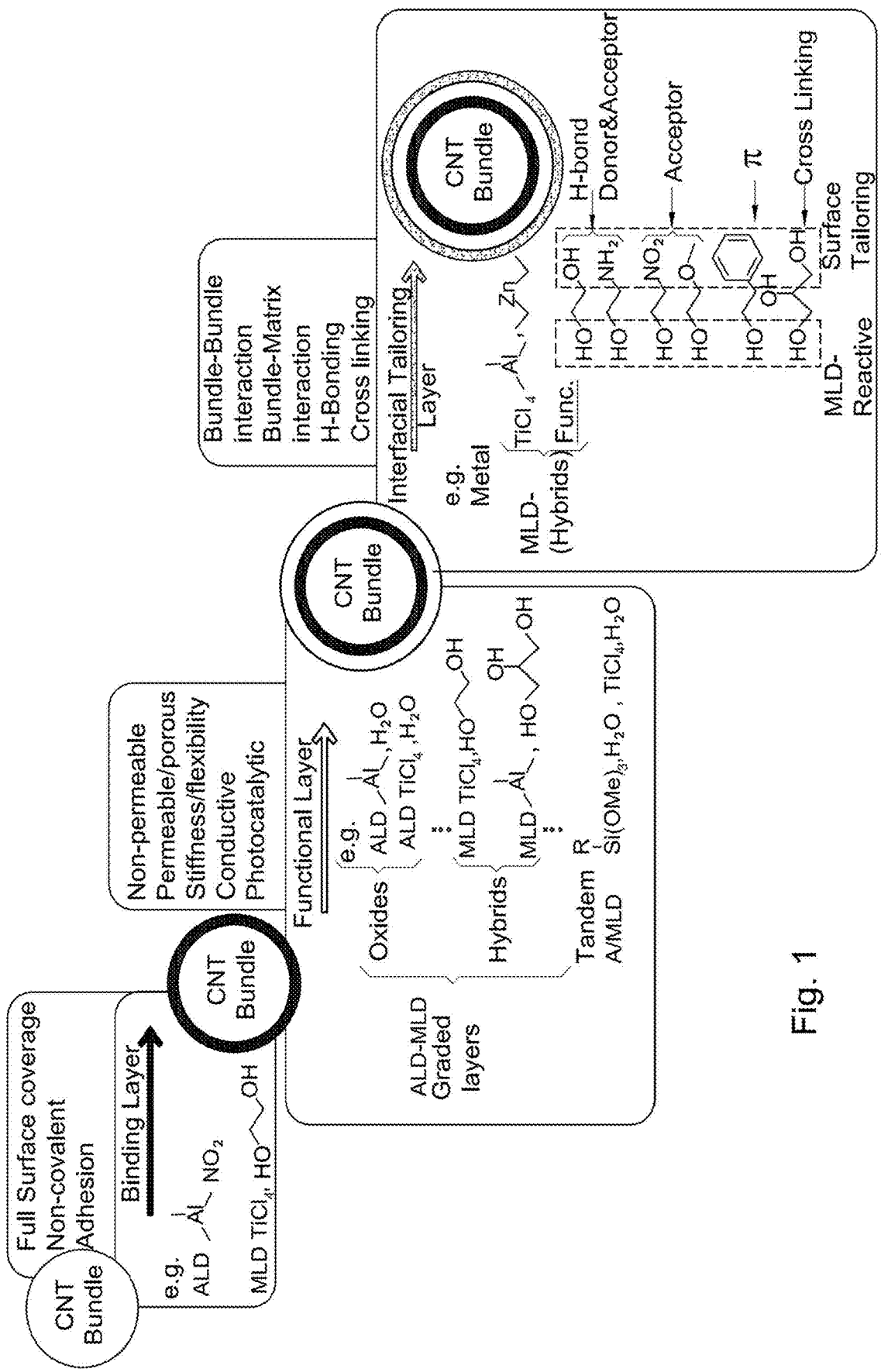
FIG. 1 depicts the methodology of the invention, utilizing vapor methodologies for tailoring CNT-based nanocomposite yarns including ALD, MLD, ALD-MLD, and tandem A/MLD.

The generality of the technology disclosed herein is depicted in FIG. 1. As shown, the technology provides a new platform for the construction of nanocomposite yarns based on CNT webs with the ability to design the overall materials qualities such as strength, durability, strain tolerance, electronic characteristics, as required for super capacitor applications, use as anodes, and surface properties such as hydrophilic/hydrophobic and permeability required for advanced membrane applications. Furthermore, utilizing layer-by-layer deposition of the composite matrix, applied to CNT web and to CNT mats (woven and non-woven), prior to yarn formation, enables to systematically vary the interface details and functionalities, and study the nanocomposite properties across scales, ranging from the molecular, nano, and macro scales, which results in significant insights, in addition to the direct impact originating from extending available materials and diversity.

Merging the vapor phase methodologies presented herein with advanced deposition techniques, such as spatial ALD as disclosed herein enable scaling of the design principles applied at the atomic, and molecular levels principles to the macroscopic scale yielding tailored nanocomposite yarn materials.

The technology involves several principles: (i) relying on CNT sources with high geometrical aspect ratios other than CNT powders or suspensions, drawn to CNT web structures, or CNT mats, and by (ii) customizing and merging atomic and molecular layer deposition chemistries with CNT web processing, including new tandem-catalytic A/MLD chemistry, and by (iii) utilizing emerging vapour phase methodology, spatial-A/MLD (S-A/MLD), for treatment of the CNT webs and CNT mats (woven and non-woven).

One of the hallmarks of atomic and molecular layer deposition is the highly conformal, pin-hole free layers forms on a variety of substrates and nanosystems, including nanowires and nanotubes. This invention provides optimal surface coverage of the CNT bundles with the desired add-layer, which is the nanocomposite matrix component, deposited from the vapor phase. Vapor phase chemistry is utilized to overcome the difficulties encountered in introducing the matrix components (a) in the condensed phase, and (b) once the CNT webs are collapsed to the yarn structures. This allows to the tailoring of the relevant properties of the derived CNT-nanocomposite yarn materials.

Key consideration to address is the type of vapor phase chemistries that are applied to the CNT webs and CNT mats (woven and non-woven) to ensure uniform surface modification with tight interface interactions between the CNTs and the deposited matrix. Here is a non-limiting list of considerations:

(I) Hybrid Organic-Inorganic Matrix Deposited by MLD.

The CNT web and CNT mats (woven and non-woven) that are uniformly coated with hybrid organic-inorganic layers, metalcones, which are metal alkoxide films that comprise of bi-, or tri-functional organic components such as bi-functional alcohols, covalently attached to inorganic metal component, yielding organic-inorganic (metal oxide) hybrid films with tunable surface and mechanical properties. Relying on MLD for uniform deposition of organic-inorganic hybrid layers on CNT webs and CNT mats (woven and non-woven) by MLD not only address the surface incompatibility of CNTs encountered for pure metal oxides, but also provides a handle for tuning the mechanical properties of deposited nanocomposite matrices by constructing in a layer-by-layer fashion hybrid organic-inorganic (MLD) and purely inorganic (ALD) superstructures by combined MLD-ALD processes. According to some embodiments of the present invention the hybrid layer is deposited establishing the required interfacing to the CNT surface, then an inorganic layer is deposited, and the sequence is repeated. Each step is independent of the other. According to other embodiments of the present invention, an A/MLD tandem catalytic process is employed where each sub-cycle catalyze the deposition of the complementary sub-cycle. MLD-ALD superstructures offers continuous tuning of the mechanical properties of the deposited layers ranging between polymer-like characteristics for all-MLD to oxide-like properties for all-ALD, and desired intermediate according to the MLD-ALD proportions of the process applied. for example hybrid Ti—EG—$TiO_2$ is deposited by MLD-ALD (using $TiCl_4$ as metal source and ethylene glycol and $H_2O$ precursors for the hybrid and pure oxide, respectively). CNT webs may be modified with Al—EG—$Al_2O_3$ super structures (using trimethylaluminum (TMA) can be used as metal source and ethylene glycol and H₂O precursors for the hybrid and pure oxide, respectively), and\or Zn—EG-ZnO superstructures (using diethyl zinc as metal source and ethylene glycol and H₂O precursors for the hybrid and pure oxide, respectively). A binding layer for CNT-composites with tailored surface functionalities, deposited bytandem A/MLD, may be used for surface decoration with free amines, protected amines, and any other functional groups.

(II) Metal-Oxide Matrix Deposited by ALD.

Farmer, D. et al. have demonstrated that single-walled CNT can be functionalized without degradation of their electronic properties by ALD treatment of NO2 and TMA, forming an adsorbed layer that mediate high quality, conformal, and smooth deposition of oxides. The present invention provides CNT webs and CNT mats (woven and non-woven) with maximal surface coverage of the CNTs. CNT-composites with stoichiometric oxides such as $Al_2O_3$, $TiO_2$, ZnO, as well as non-stoichiometric oxides are provided for use as enhanced photocatalysis and conductive oxide.

Implementation of Vapor Phase Chemistry to CNT Webs and CNT Mats (Woven and Non-Woven) by Customized A/MLD Reactor Setup The surface modification classes listed above, spanning, oxides, organic-inorganic hybrids, and combinations of inorganic binding layer with hybrid organic-inorganic overlayers provide a versatile platform for tailoring the CNT interfaces for designing the nanocomposite yarn materials with desired mechanical, electronic, and even photocatalytic properties such as self-cleaning.

The combined strategy provided by the present invention overcomes the inherent difficulties associated with condensed phase treatments of high aspect ratio CNTs in the context of composite materials. Introduction of the advanced vapor phase chemistry capabilities to CNT webs and CNT mats (woven and non-woven) disclosed herein overcomes the problems usually encountered in tailoring a CNT-matrix composite by affording a uniform, complete surface interaction of the deposited matrix and CNT interfaces. The solution provided by the present invention to these issues is achieved by coupling appropriate vapor phase chemistry and applying A/MLD specifically to the CNT web region and CNT mats (woven and non-woven), prior to collapse of the CNTs. Importantly, obtaining optimal functionality of the high loading CNT-based nanocomposites, requires that the deposited matrix have a uniform, continuous, and maximal areal coverage over the CNT interfaces. Merging the vapor phase methodologies disclosed herein with advanced deposition techniques, such as spatial ALD as disclosed herein enable scaling of the design principles applied at the atomic, and molecular levels principles to the macroscopic scale yielding tailored nanocomposite yarn materials.

Implementation of the Vapor Phase Chemistries to CNT Webs and CNT Mats (Woven and Non-Woven) by Spatial A/MLD Spatial ALD (S-ALD) is a variant of conventional. The uniqueness of S-ALD relies on the fact that the reactive precursors used for layer-by-layer deposition of the films are separated in space instead the separation in time in conventional ALD. This distinction in the mode of operation results in striking capabilities of S-ALD compared with conventional ALD, that includes: (i) continuous processing of macroscopic substrates, (ii) about two orders of magnitude faster deposition because no pump and purge dead times, and (iii) applicability of the ALD chemistry in (inert) atmospheric pressures.

CNT Growth Considerations

The use of CNT drawing methods to form CNT webs, or continuous CVD growth of millimeter long CNTs for attaining CNT mats (woven and non-woven), and yarns with macroscopic dimensions are important. CNT forests are grown while paying attention to the specific details following well-established methods and with a particular attention to synthesis parameters which are critical for attaining high density, aligned and long CNTs that comprise the CNT forests. This includes the selection of catalyst composition, thickness, and chemical potential adjusted by pre-treatment procedures. In addition, standard growth parameters such as time, temperature, pressure, flow rate, and source gases are taken into account for providing the optimal CNT forest substrates. For example, it was reported that Fe catalyst layer pre-treatment conditions are critical for attaining highly spinnable CNT forests (Zhang Y, et al., 2009, *ACS Nano*, 3 2157). and that ethylene ($C_2H_4$) is a preferred carbon source over acetylene ($C_2H_2$), for example, for attaining CNT forests used for CNT drawing and spinning, as well as additional preparation details (Jia J et al. 2011, *Carbon*, 49, 1333).

The methods described herein may be generalized to various carbon-based materials that may be modified using ALD, MLD and ALD-MLD combinations.

The use of ALD-MLD enables to tailor the deposition of the thin layer to the carbon material surface by combining oxide layers, organic layers, and oxide-organic hybrid layers. Additional control over nucleation of the thin film at the carbon material surface may be achieved by controlling the substrate temperature by local cooling and heating and by temperature gradients and temporal ramping. Examples of carbon based materials include single, double, multi-wall carbon nanotubes and carbon nanotube bundles. The carbon based materials may be in the form of aerogel, woven mats, non-woven mats, fibers, bundles, aggregates, and more.

The properties of the carbon based materials that are affected by the thin films deposited from the vapor phase using ALD, MLD and ALD-MLD combinations include mechanical, electrical, thermal, wetting, surface roughness, chemical reactivity and more. Initial vapor phase processing, without solvent may be followed by wet chemical processing after the wetting properties were modified in the first stage of ALD/MLD vapor phase reaction The surface modified carbon materials can be used as-is or as precursors for composite materials, for example, to fabricate nanocomposite yarns should be generalized to carbon nanotube composites, carbon nanotube bundles composites, carbon fiber composites, carbon nanotube mats composites, carbon nanotube powders composites.

Following the modification of the carbon based materials by vapor phase reactions further chemical treatments in solvents may be performed more effectively after the wetting properties were modified in the first stage of ALD/MLD vapor phase reaction.

ALD/MLD application method may include conventional ALD reactor, fluidized bed rector, high pressure spatial ALD or other type of reactor.

Non-Limiting Examples of Embodiments

While examples provided herein have been performed on CNT mats, identical procedures may be applied to other CNT macrostructures such as yarns, fibers, webs, carbon cloth, buckypaper and others.

Examples and utilities may be divided into different groups:

1. Tuning mechanical properties of CNT macrostructures using ALD-MLD;
2. Tuning wetting properties of CNT macrostructures using ALD-MLD;
3. Introducing functional groups such as amine groups to CNT macrostructures by ALD-MLD.
4. Combining Ti—EG with CNT macrostructures for taking advantage of the molecular permeability and other properties.
5. Combining Ti—EG with CNT macrostructures for photocatlytic functions, by applying the ALD/MLD procedure, using e.g., $TiCl_4$—EG (MLD) and $TiCl_4$—$H_2O$ (ALD).

As stated herein, the present invention provides vapor phase chemistries that yield organic-inorganic hybrid thin films, for example, metal oxide-organic hybrids that are combined with CNT webs and CNT mats (woven and non-woven) to form new classes of nanocomposite yarn materials by vapor phase deposition techniques. MLD permits the introduction of molecular components in the deposited films. These are then used as molecular functionalities with the aim of tailoring the interfacial properties, with well controlled coverage, thickness, composition, and stoichiometry.

A non-limiting list of three classes of nanocomposite yarn materials that are prepared by applying A/MLD to the CNT web and to CNT mats (woven and non-woven) are exemplified in examples 1-3:

Example 1: Nanocomposite CNT Yarn Materials with Optimized Mechanical Properties Methods: vapor phase chemistry protocols were developed for depositing the yarn nanocomposite matrix components, producing highly uniform, conformal coatings of CNT web surfaces and CNT mats (woven and non-woven) with maximal surface coverage, thus maximizing the overall interaction while excluding covalent modification at the CNT structures.

Results: CNT webs and CNT mats (woven and non-woven) with high surface density functionalities for intimate CNT-matrix binding. Such nanocomposite yarn materials are desired for numerous applications where the mechanical properties of the materials are important.

Example 2: Nanocomposite CNT Yarn Materials Coupled with Photocatalytic Matrix Layer Such materials are highly attractive for self-cleaning fabrics, including advanced membranes and numerous other applications.

Example 3: Nanocomposite Yarn Materials with Tailored Electronic Properties

Methods: Nanocomposite CNT yarn materials were coupled to electro-active matrix deposited at the CNT web stage using ALD and MLD deposited conductive oxides.

This allows the tailoring the electronic properties of CNT-nanocomposite yarns with desired electronic functionalities. Such nanocomposite yarn materials are desired for numerous applications such as anodes, batteries, and super capacitors.

Example 4: Continuous Synthesis of Nanocomposite Yarn Materials

Methods: Based on the results of examples 1-3 a class of nanocomposite yarn materials was selected for integration with spatial ALD to yield continuous synthesis of nanocomposite yarn materials.

This include low pressure ALD, atmospheric pressure spatial ALD. Initial vapor phase processing, without solvent may be followed by wet chemical processing after the wetting properties were modified in the first stage of ALD/MLD vapor phase reaction.

This objective is achieved by continuous S-ALD processing coupled to CNT-webs and CNT mats (woven and non-woven) with controlled interface engineering, CNT alignment and dispersion within the deposited matrix. (high risk, high gain)

Example 5: Organic-Inorganic Hybrid Films

Here, two prototypes of organic-inorganic hybrid films were developed, where molecular components (R) are embedded in the deposited films.

Two modes (I and II) are exemplified:

Mode I (I.a) MLD of -M-O—(R)—O—M-, as in hybrid organic-inorganic thin films, also called metalcones, such as titanium-ethylene glycol (for M=Ti and R=$C_2H_4$, Ti-EG). In addition, when Ti-EG films are annealed, oxygen deficient $TiO_2$ oxide is formed by controlled combustion of the organic component, (R), embedded in the thin film. This gives an oxide with an adjustable electronic structure including shifting of band-edge positions and introduction of in-gap defect states that mediate efficient electron transfer.

The inventors have successfully demonstrated the first application of MLD for the preparation of highly photoactive thin films. This means that the organic components introduced by MLD can either be used as a sacrificial component to control the oxide electronic properties, or as a structural component to attain uniform coverage of the CNT scaffold and additional functionalization of the CNT-hybrid materials.

(I.b) Molecularly Permeable Films by MLD.

The use of MLD for tailoring metal oxide (MO) thin films with controlled compositions, doping, electronic structure, and architectures was demonstrated. A key characteristics of the as-prepared Ti—EG films, and other metalcones is the film permeability that provides a versatile handle for additional functionality and varying the interface properties. The permeability of Ti—EG films was studied and compared with conventional $TiO_2$ films (by ALD). Ti—EG films prepared by MLD and annealed result in thin oxide coatings that are pin-hole free, yet retain electronic communication between the solution and the underlying conductive electrode.

These properties are considered when designing modified CNT webs and CNT mats (woven and non-woven) that is used as precursors for nanocomposite yarn materials for advanced membrane and battery applications that exhibits response triggered by either pH changes or the presence of cations in solutions (I.c) Doping of Ti—EG films with metal cations. Ti—EG films permeability can be used for adsorbing cations that function as dopants once the modified Ti—EG films are annealed. For example, Ti—EG films adsorbed with Ni and Fe were annealed at various temperatures and characterized. Band gap (BG) values were extracted using Tauc's equation for the undoped, Fe-doped, and Ni-doped films for a range of anneal temperatures. A monotonic BG narrowing is obtained for doped films annealed up to 750° C. with lowest BG values obtained for both Fe-, and Ni-doped Ti—EG of 2.74 and 2.70 eV, respectively. The facile doping of $TiO_2$ was utilized for optimizing the protective layer band structure and improvement of the overall photocatalytic performance of the system.

Figure 2:
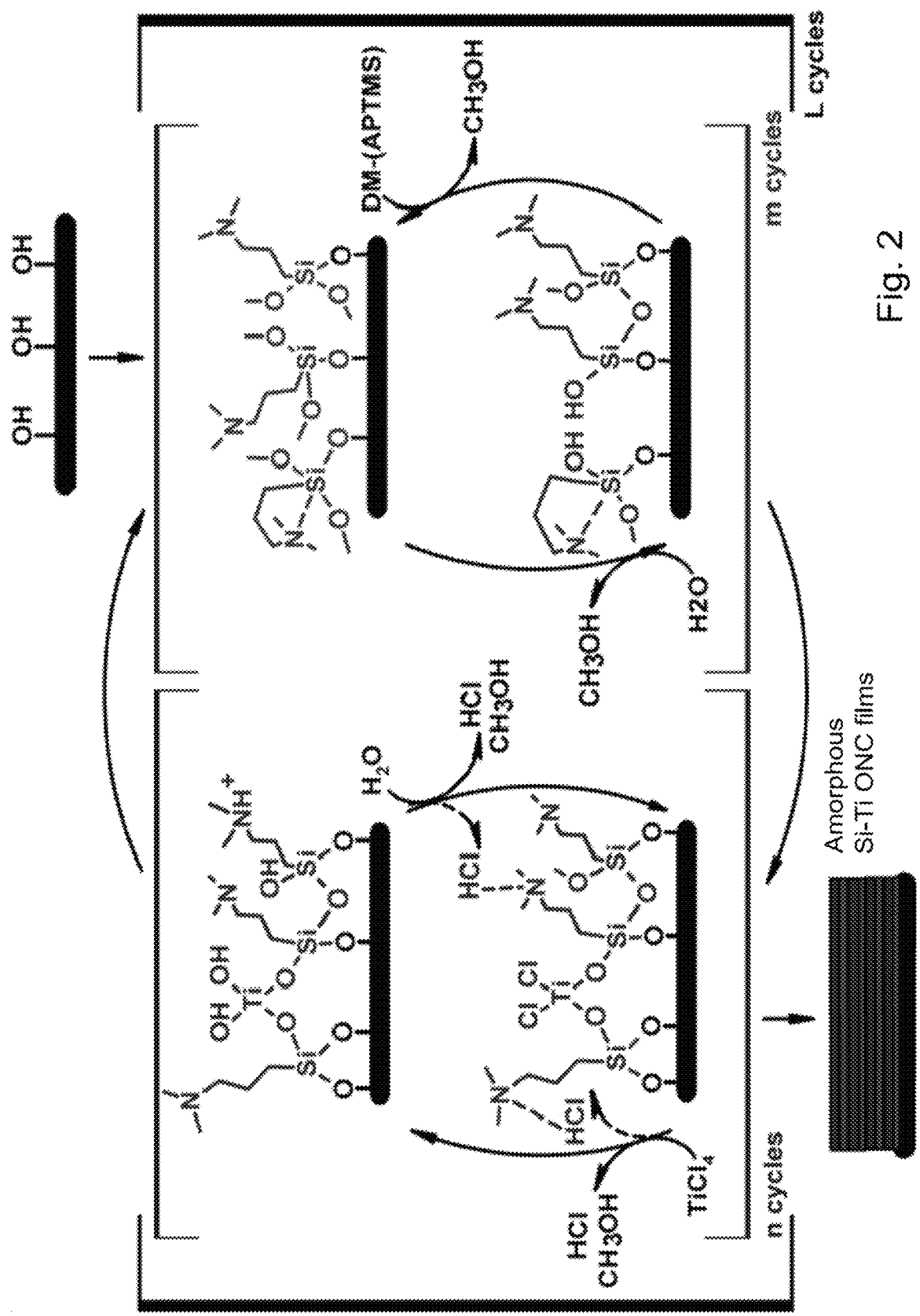
FIG. 2 depicts ALD/MLD deposition process for the inorganic-organic $[-[O-(Si-R)]m-[-(Ti)-]n-O]_L$ hybrid thin film for trimethoxysilanesiloxane with R=N,N-dimethyl-3-aminopropyl, $H_2O$, $TiCl_4$ used as molecular precursors. Film deposited by L cycles of tandem ALD-MLD process with composition tuning by repeating n cycles of ALD and m cycles of MLD.
Figures 3A, 3B, 3C:
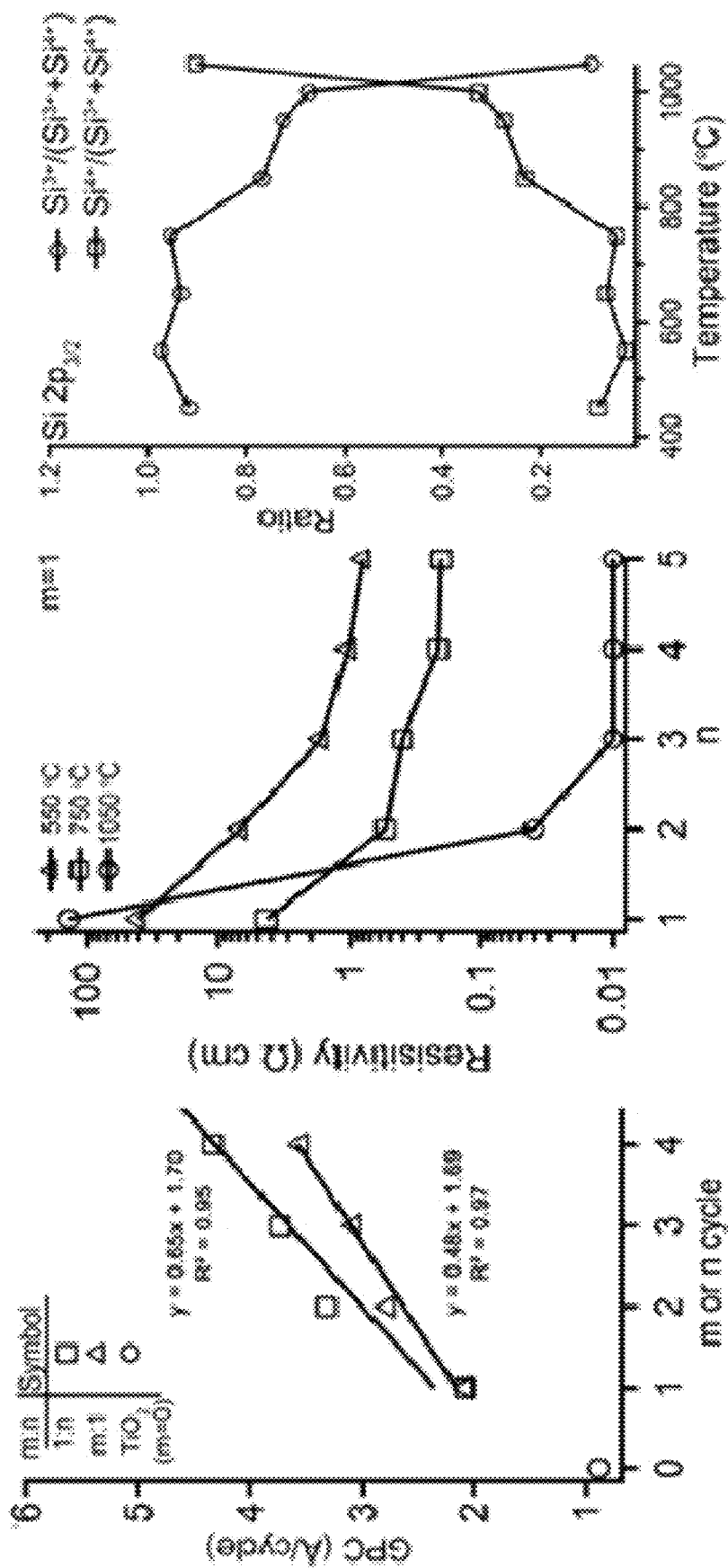
FIGS. 3A-C depicts properties of thin films prepared by tandem Ti—Si A/MLD.

Mode II (II.a) Tandem A/MLD of —O—(Si—R)—O—(Ti)—O, where the molecular component R is directly attached to Si, having a Si—C bond (FIG. 2). The organic component is used here for tailoring the interfacial properties and for coupling the coated CNT surface, by introducing functional groups such as amine, protected amine, or other for covalent, or non-covalent interactions, and for designing the nanocomposite-matrix interactions. Another feature of the tandem A/MLD deposited films originate from the layered structure of Si- and Ti-phases. The silicon sub-oxide form, $[SiO_x]$ (with Si—C bond), is deposited over the titanium oxide phase in its stoichiometric form, $[TiO_2]$. Upon thermal treatment under Argon the following internal rearrangement takes place: $[SiO_x]$—$[TiO_2] \rightarrow [SiO_2]$—$[TinO_{(2n-1)}]$, where the latter phase is a conductive Magnéli phase (FIG. 3B). The introduction of the relatively labile Si—C carbon affects the kinetics of the phase transformations.

In summary, this means that the tandem A/MLD of Si-, Ti-layers can be used as a vapour phase method to introduce amine and other surface functionalities at the CNT surface, or by additional thermal treatment yield conductive oxide phases that are known as useful anode materials for various applications.

Optimization and Characterization of a Tandem A/MLD Growth Process for Ti—Si Oxide Nanocomposites Layers Linear film growth is demonstrated for various A/MLD process ratios and the respective growth per cycle (GPC) extracted from the thickness vs. cycle (FIG. 3A). The A/MLD films annealed under Argon yield conductive oxide layers, resulting in a facile transformation of the $TiO_2$ to the conductive Magnéli phase. The transformation of $TiO_2$ anatase and rutile phases in the films to conductive Magnéli phases is deduced by X-ray diffraction (GIXRD configuration) and Raman analysis (not shown).

A strong dependence of the film conductivity on the specific annealing temperature conditions was found, depending upon the A/MLD n/m cycles ratio (FIG. 3C, 1050° C.). Study of the electronic properties of Ti—Si oxide nanocomposites films by transport measurements, UV-VIS optical absorption, and XPS measurements indicate the co-existence of metallic- and semi-conducting phases.

Generalization of the Tandem A/MLD to other silane precursors.

Figures 4A, 4B, 4C:
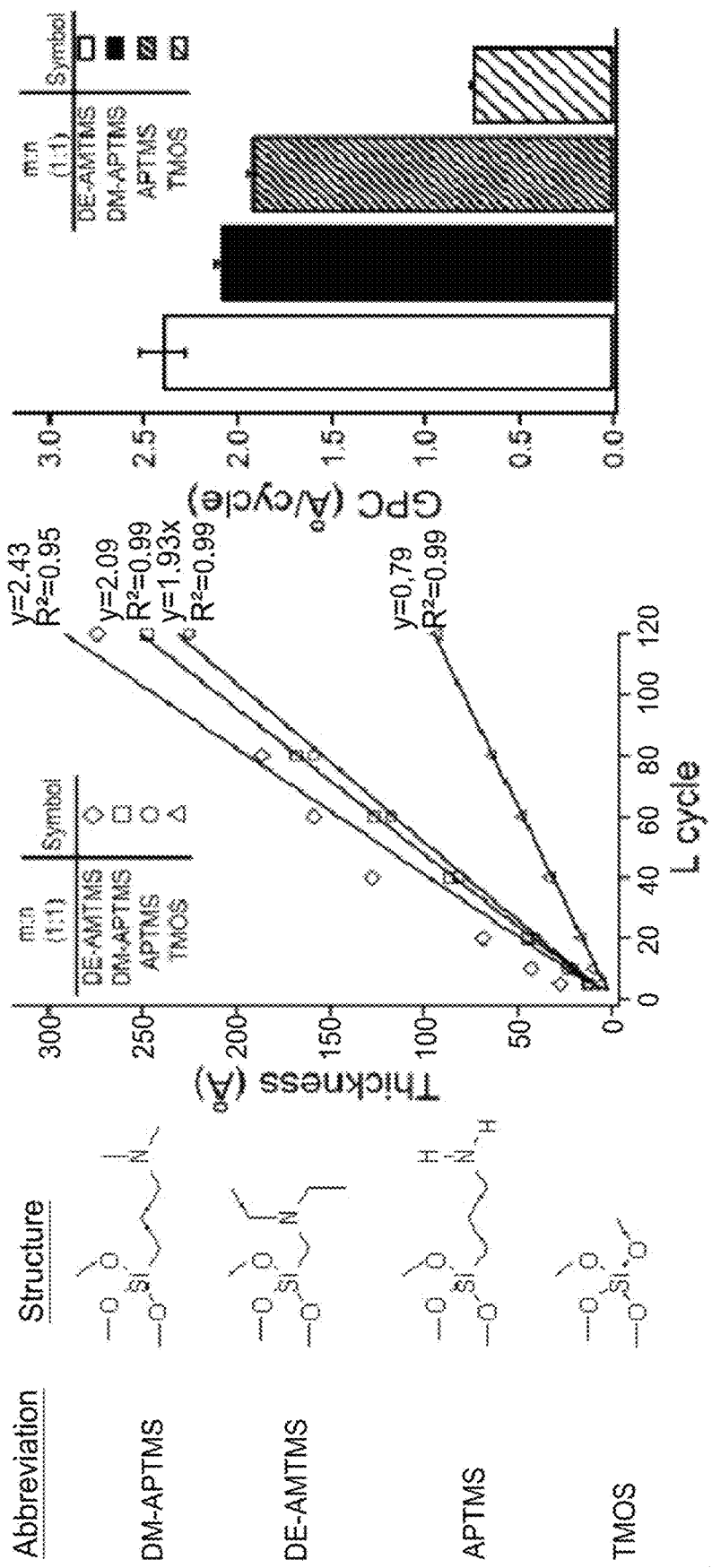
FIGS. 4A-C depicts tandem A/MLD for Ti—Si hybrid films deposited with various silane precursors.
Figure 5:
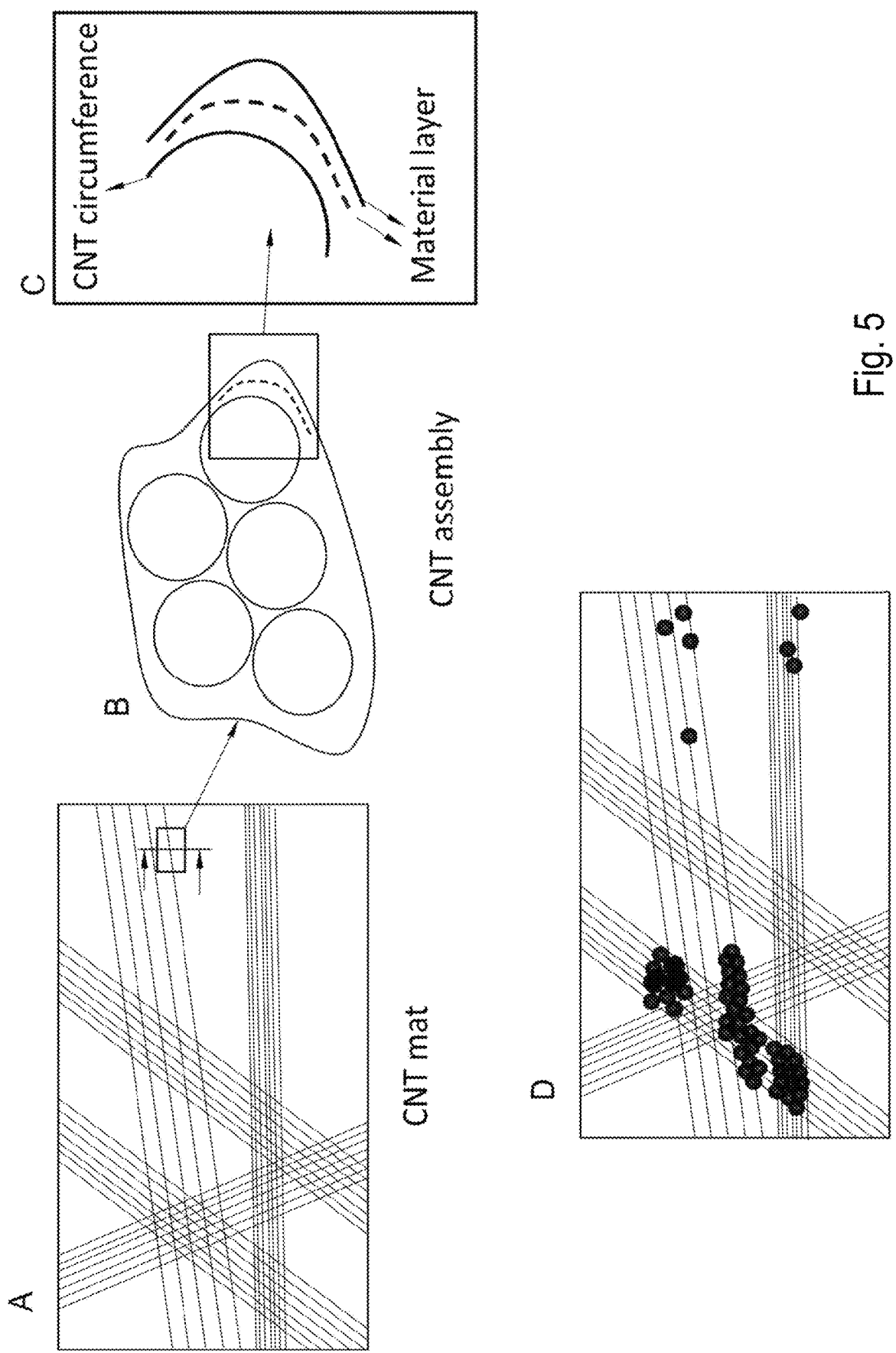
FIG. 5 provides a depiction of a CNT mat comprising a plurality of CNT assemblies and treated according to embodiments of the present invention.
Figure 6:
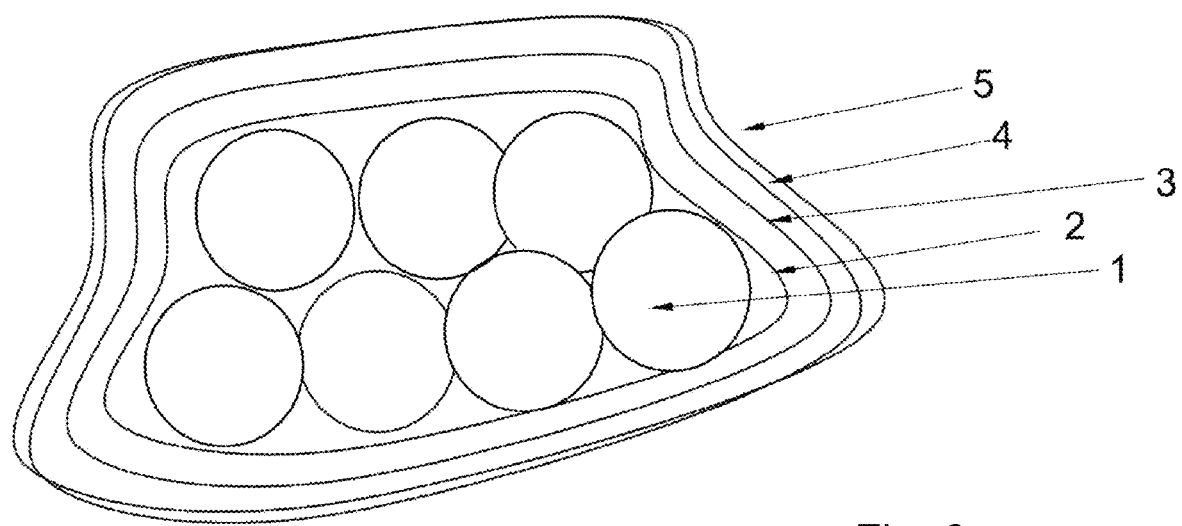
FIG. 6 provides a zoom-in view of an assembly of CNTs according to the invention.

The tandem process is demonstrated for four types of silane precursors listed in FIGS. 4A and 4C with precursor exposure times in the range of 0.15-1.2 sec and precursor purge times in the range of 7-25 sec (FIG. 4B). The selected side groups provide free amine ($NH_2$) and protected (NMe2, NEt2) amines Additionally, a non-functional silane (TMOS) also yield Ti—Si hybrid films, although with a lower growth per cycle (GPC) value owing to the lack of base-catalysis in the process. For TMOS the deposition is catalyzed by acid (HCl) evolved at the $TiCl_4$-$H_2O$ sub-cycle.

The invention claimed is:

1. A composite of a CNT assembly comprising a plurality of carbon nanotubes (CNTs), at least one metalcone material layer comprising at least one metalcone material directly non-covalently associated with said CNTs, and at least one hybrid organic-inorganic material non-metalcone layer having the structure:

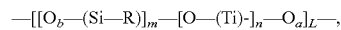

wherein $O_a$ is an oxygen atom and $O_b$ is an oxygen atom, said at least one hybrid organic-inorganic material non-metalcone layer being positioned on the at least one metalcone material layer and is associated therewith via the oxygen atom designated $O_a$ or $O_b$,
the composite being made, by tandem molecular and atomic vapor phase chemical modification,
wherein the tandem molecular and atomic vapor phase chemical modification comprises m number of molecular vapor deposition cycles and n number of atomic vapor deposition cycles,
wherein each of m and n, independently, is between 1 and 50,
wherein L is between 1 and 100, and
wherein R is an organic component, forming a Si—C bond, the organic component being selected or modifiable to render the CNT assembly with one or more collective properties selected from the group consisting of mechanical, chemical, physical or electrical properties,
wherein the CNT assembly is selected from the group consisting of CNT mats, CNT yarns, CNT fibers, CNT webs, carbon cloth and buckypaper.

2. The composite according to claim 1, wherein the at least one metalcone material is distributed over a surface of the plurality of CNTs in a continuous form, either fully engulfing the plurality of CNTs, or distributed over the plurality of CNTs in spaced apart regions.

3. The composite according to claim 1, being in a form of a multilayered structure, wherein the CNT assembly forms the inner-most part of the multilayered structure and each of the at least one metalcone material forms at least one layer on a surface of the CNT assembly.

4. The composite according to claim 1, wherein the at least one metalcone material is selected amongst metal alkoxides having a metal atom covalently bonded to at least one organic moiety or metal oxide having an oxygen atom forming an oxide or a hydroxide species.

5. The composite according to claim 1, wherein the at least one metalcone material layer comprises a plurality of metal atoms in-layer associated to each other, directly or via bridging atoms or organic ligands, wherein the plurality of metal atoms are further associated with one or more surface exposed hydroxides, oxides and/or alkoxide groups.

6. The composite according to claim 5, wherein the metal atoms are selected from the group consisting of Zn, Zr, Fe, Ti, V, Cu, Ni, Bi and W.

7. The composite according to claim 5, wherein the metal atoms are selected from the group consisting of Al, Ti, Zn, Fe, V, Ni, Cu and Cr.

8. The composite according to claim 5, wherein the metal atoms are selected from the group consisting of Ti, Al or Zn.

9. A process for manufacturing a composite of claim 1 comprising at least one CNT assembly and one or more material layers provided directly on the CNT assembly, the process comprising:

forming by ALD a first material layer on the at least one CNT assembly; and forming one or more additional material layers on said first material layer by ALD, MLD, combined ALD/MLD or tandem ALD/MLD, wherein the first material layer comprises at least one metalcone and wherein the CNT assembly is part of a CNT macrostructure selected from a CNT mat, a CNT yarn, a CNT fiber, CNT web, a carbon cloth and a buckypaper.

10. The process according to claim 9, wherein at least one of the one or more material layers comprises at least one metalcone.

11. The process according to claim 10, wherein the metalcone precursor composition comprises at least one metal source and at least one hydroxyl precursor.

12. The process according to claim 9, comprising:

treating a CNT assembly under ALD conditions with at least one metalcone precursor composition to form a first coating or film of at least one metalcone material on the surface of at least one CNT assembly;

treating the CNT assembly one or more times under ALD, MLD or ALD/MLD conditions to form one or more additional material layers on the first coating or film.

13. The process according to claim 9, comprising:

treating a CNT macrostructure under ALD conditions with at least one metalcone precursor composition to form a first coating or film of at least one metalcone material on the surface of at least one CNT assembly comprised in the macrostructure;

treating the CNT macrostructure one or more times under ALD, MLD or ALD/MLD conditions to form one or more additional material layers on the first coating or film;

wherein the first coating or film of the at least one metalcone material is non-covalently associated to the at least one CNT assembly.

14. The process according to claim 13, comprising treating the CNT macrostructure one or more times under ALD, MLD or ALD/MLD conditions to form a bilayer or a multilayered structure on the surface of the first coating or film, wherein each of the layers in the bilayer or multilayer is same or different, each optionally comprising at least one metalcone material.

15. The process according to claim 9, wherein the at least metalcone precursor composition comprises at least one metal source and one or more same or different ligand groups selected from at least one hydroxide precursor and optionally at least one organic alcohol material.

16. The process according to claim 15, wherein the at least one metal source is in the form of a metal salt or a metal complex.

17. The process according to claim 9, wherein the metalcone precursor composition comprises at least one metal source, at least one organic alcohol and at least one hydroxyl precursor.

\* \* \* \* \*